United States Patent [19]

Brown

[11] Patent Number: 4,536,744
[45] Date of Patent: Aug. 20, 1985

[54] ANALOG TO DIGITAL CONVERTER FOR PRECISION MEASUREMENTS OF A.C. SIGNALS

[75] Inventor: Neil L. Brown, Falmouth, Mass.

[73] Assignee: Neil Brown Instrument Systems, Inc., Cataumet, Mass.

[21] Appl. No.: 508,582

[22] Filed: Jun. 28, 1983

Related U.S. Application Data

[63] Continuation of Ser. No. 147,220, May 6, 1980, abandoned.

[51] Int. Cl.³ .............................................. H03K 13/02
[52] U.S. Cl. .......................... 340/347 AD; 340/347 M; 340/347 NT; 324/99 D
[58] Field of Search .... 340/347 AD, 347 M, 347 NT, 340/347 CC; 324/99 D

[56] References Cited

U.S. PATENT DOCUMENTS

| | | | |
|---|---|---|---|
| 3,019,426 | 1/1962 | Gilbert | 340/347 AD |
| 3,142,834 | 7/1964 | Falk et al. | 340/347 AD |
| 3,445,839 | 5/1969 | Engelberg et al. | 340/347 CC |
| 3,480,949 | 11/1969 | Charbonnier et al. | 340/347 AD |
| 3,654,560 | 4/1972 | Cath et al. | 340/347 NT X |
| 3,656,153 | 11/1972 | Takeda et al. | 340/347 M X |
| 3,892,281 | 7/1975 | Brown | 73/362 AR |
| 3,926,056 | 12/1975 | Brown | 324/99 D X |
| 3,939,408 | 2/1976 | Brown | 324/30 B |
| 3,940,693 | 2/1976 | Brown | 324/83 A |
| 4,196,419 | 4/1980 | Brown | 340/347 AD |
| 4,339,958 | 7/1982 | Shauger | 340/347 NT X |

OTHER PUBLICATIONS

The Engineering Staff of Analog Devices, Inc., Analog-Digital Conversion Handbook, 6/1972, pp. I-33 & 34; II-48 to II-50.
Bares et al., Combined ADC-DAC, IBM Technical Disclosure Bulletin, vol. 10, No. 9, 2/1968, pp. 1372, 1373.
Hoeschele, Analog to Digital/Digital to Analog Conversion Techniques, J. Wiley & Sons, Inc., 1968, pp. 381-383.
Brown, A Precision CTD Microprofiler, 1974 IEEE International Conference on Engineering in the Ocean Environment, vol. 2, pp. 270-278.

Primary Examiner—T. J. Sloyan
Attorney, Agent, or Firm—Lee & Hollander

[57] ABSTRACT

An analog-to-digital converter for performing extremely accurate measurements of AC voltages. In the conversion process, the most significant bits are determined using a precision ratio transformer having multiple, binary-weighted windings which are selectively connected in series during a first interval to provide an approximation to the input voltage to be measured via a successive approximation conversion technique. The digital value so determined is clocked into a bi-directional counter. The transformer output signal at the end of the first interval is subtracted from the input signal to give an AC residue signal which represents the round-off error from the successive approximation conversion performed during the first interval. The residue signal is synchronously detected and applied to a dual slope type of converter during a second interval, the digital output thereof being accumulated in the counter. The circuit inherently provides for filtering of the input signal and accurately measures the average value of the input signal over the measurement interval even when the input signal varies during the measurement.

19 Claims, 4 Drawing Figures 4,536,744

ANALOG TO DIGITAL CONVERTER FOR PRECISION MEASUREMENTS OF A.C. SIGNALS

This application is a continuation of application Ser. No. 147,220 filed May 6, 1980, abandoned.

BACKGROUND OF THE INVENTION

Analog-to-digital converters are used in applications where a digital representation of an analog value is needed. Two of the primary criteria of A/D converters are the resolution or number of digital bits in the output, and the speed required for each conversion. One method of achieving very high resolution A/D converters is by using a precision, multiple-winding transformer as a D/A converter in a successive-approximation A/D conversion. One such transformer-type A/D converter is described in U.S. Pat. No. 3,926,056 to Neil L. Brown for "Conductivity, Temperature and Pressure Measuring System."

The accuracy of a transformer A/D converter may be made very high. Precision ratio transformers can be designed which are capable of maintaining output voltage ratios precisely proportional to turns ratios. In special cases, the precision of the voltage ratios can be as high as one part in $10^8$, and the accuracies which can be achieved by successive approximation A/D converters using this type of transformer are comparable. Transformer A/D converters are especially suited to applications in which the transducer whose output is being digitized requires an AC excitation signal.

Although the use of a precision ratio transformer allows extremely accurate analog-to-digital conversion, the use of such a transformer with a successive approximation technique has certain disadvantages. While the digital representation provided by a successive approximation technique in response to a varying input signal is an accurate representation of the instantaneous value of that signal at some point in time during the conversion interval, there is no indication of exactly when during the conversion interval this point occurred. Furthermore, when compared with either the average value of the input signal over the entire conversion interval or the value of the signal at any predetermined point during the conversion interval, the digital representation of an increasing input signal has a positive bias while the representation of a decreasing input signal has a negative bias. In other words, the bias or round-off error in the digital representation is correlated with the slope of the signal. This error characteristic is unacceptable for many types of applications in which large numbers of digital values are statistically reduced to provide meaningful data. While the addition of circuits such as sample-and-hold input stages can eliminate this correlation, the design of these circuits with sufficient accuracy for very high resolution A/D conversions—16 to 20 bits and higher—is expensive and difficult.

SUMMARY OF THE INVENTION

The present invention takes advantage of the extremely high precision provided by a successive-approximation conversion using a transformer D/A converter, while eliminating the above-described correlation between the error and the slope of the signal being converted.

Briefly, the most significant bits are calculated using a successive approximation register and a precision transformer D/A converter. The transformer D/A converter provides an AC output voltage whose amplitude is proportional to the digital value currently provided by the successive approximation register. The transformer D/A output is subtracted from the A.C. analog input signal to provide an error voltage. The phase (or polarity) error indicates the relative magnitudes of the D/A output and analog input signals and is applied to the successive-approximation register to determine the value of each bit. In the preferred embodiment described, the sign and 9 most significant bits are determined in this manner.

Due to the precision of the transformer D/A, the error voltage following the determination of the 9 MSB's is a very accurate representation of the digital round-off error. This error voltage is then demodulated and integrated for a fixed period of time, and the resulting value is digitized to provide an additional 9 least significant bits in a manner similar to a dual-slope conversion process. The second digitization process is done in a manner which allows modification of the previouslydetermined MSB's, and the final value represents the average value of the analog input signal over the integration interval. In the described embodiment, 18 bits and a sign bit are calculated in 2 ms.

DESCRIPTION OF THE DRAWINGS

The operation and advantages of the present invention will become more clear upon reading the following description of the preferred embodiment in conjunction with the accompanying drawings, in which.

DESCRIPTION OF THE PREFERRED EMBODIMENT

Figure 1:
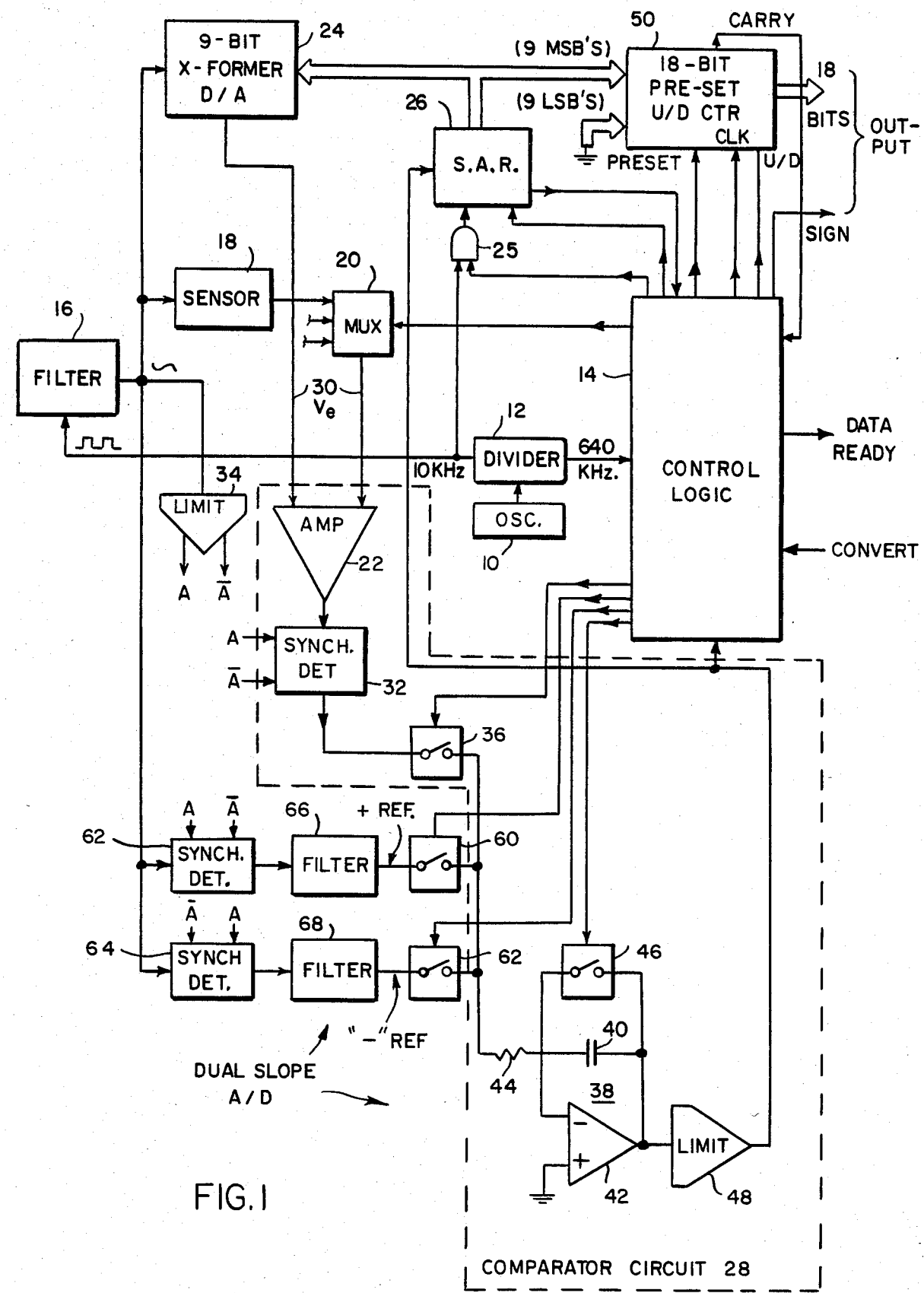
FIG. 1 is a circuit diagram of a preferred embodiment of the invention.

FIG. 1 is a block diagram showing the principal elements of the present invention. A stable, high frequency oscillator 10 provides an output signal to a divider circuit 12 which, in turn, provides synchronous clock signals at 640 kHz and 10 kHz. The 10 kHz clock signal is applied to a filter circuit 16 which, in response, provides a 10 kHz sine wave signal at its output. The sine wave output from filter 16 should have low distortion and be in precise synchronism with the input 10 kHz squarewave. Filter 16 may be implemented, for example, by means of an overcoupled, two-pole filter having a bandwidth of approximately 1 kHz and a Q of approximately 10.

The sine wave output from filter 16 is applied to the inputs of one or more sensors 18. Sensor 18 is typically a transducer providing an A.C. output signal whose amplitude is related to its input signal by a factor determined by the parameter being measured. If the circuit of FIG. 1 is being used to A/D convert the outputs from more than one sensor, the outputs from each of these sensors may be applied to an analog multiplexer circuit 20. In response to control signals from control logic 14, multiplexer 20 sequentially selects the output signals from the various sensors.

The output from filter 16 is also applied to the input of a 9-bit, precision-transformer, digital-to-analog conversion circuit 24. The D/A converter 24 may be similar to that shown and described in the above-mentioned U.S. Pat. No. 3,926,056. In response to digital signals from a successive approximation register (S.A.R.) 26, the D/A converter 24 provides a 10 kHz sine wave output signal the amplitude of which is determined by the digital inputs from S.A.R. 26. S.A.R. 26 may be implemented by means of a 74C905 integrated circuit, for example.

The output signal from sensor 18 and the output signal from D/A 24 are both aplied to a comparator circuit 28 shown within the dotted box in FIG. 1. The output signal from comparator circuit 28 is applied to S.A.R. 26, and in response, S.A.R. 26 provides digital signals which cause the output signal from D/A 24 to approximate the output signal from sensor 18.

Figure 2:
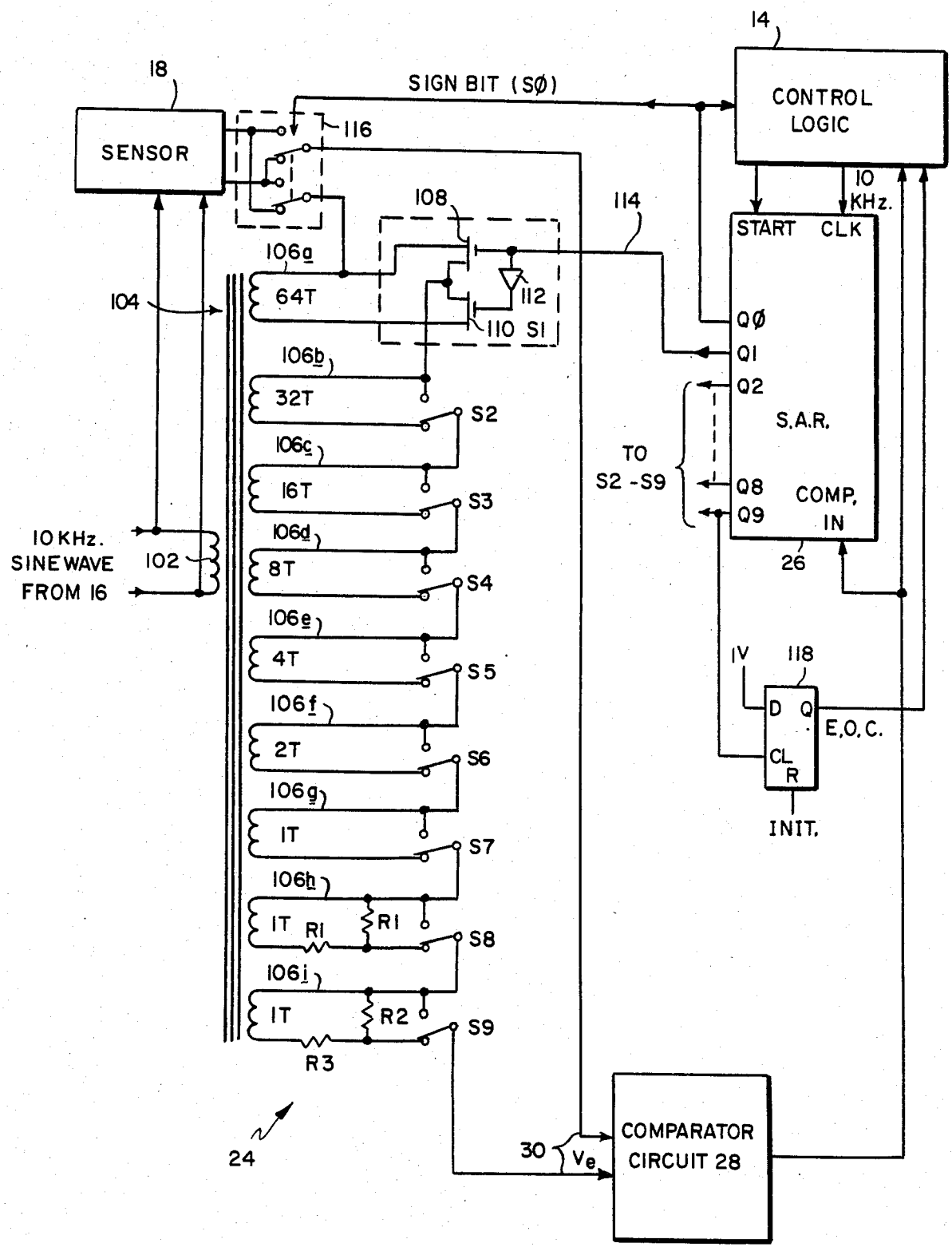
FIG. 2 shows further details of the D/A transformer circuit shown in FIG. 1.

The operation of D/A circuit 24 may be more clearly understood by referring to FIG. 2. The variable being measured by sensor 18 is represented by the ratio of the sensor output voltage to the sensor input voltage. This ratio is measure in the following manner.

The 10 kHz sine wave output from filter 16 is applied to a primary winding 102 of a precision transformer 104. Transformer 104 has 9 individual secondary windings, 106a–106i. The numbers of turns in each of windings 106a through 106g are related in a binary series. Winding 106a has 64 turns; winding 106b has 32 turns, and so on, through winding 106g which has one turn.

Winding 106h and 106i each have one turn, as does winding 106g. Two equal-value resistors R1 are connected in series across winding 106h so that the voltage present across one of the resistors R1 is equal to half of the output voltage from winding 106g. Similarly, resistors R2 and R3 are connected across winding 106i. Resistor R3 has a value three times that of R2 so that the voltage across resistor R2 is equal to one quarter the voltage from winding 106g. Thus, windings 106a through 106i provide nine output signals different by factors of two and forming a binary sequence.

Nine switches S1–S9 interconnect windings 106a–106i. Each switch S1–S9 is a single-pole double-throw, electronic switch which selectively connects either the first or second terminals of each of the windings 106 to the first terminal of the following winding. Switches S1–S9 are controlled by the Q1 through Q9 output from S.A.R. 26 applied to the control lines of switches S1–S9.

Switches S1–S9 may be implemented as shown for switch S1 within the dotted box. Switch S1 has two FET switches 108 and 110 connected in series across winding 106a. A control signal applied to the gate terminal of FET 108 controls the on or off state of the FET. The signal on line 114 is inverted by an inverter 112 and applied to the gate terminal of FET 110. Thus, when FET 108 is on, FET 110 is off, and vice versa; and the state of FET's 108 and 110 is determined by the signal on line 114.

Switches S1–S9 allow the voltages from selected ones of the windings to be summed. For example, with the movable contact of each of switches S1–S9 in their lower position, as shown in FIG. 2, windings 106 are all connected in series, and the output voltages from all of the windings are summed. Moving the contact of one of the switches from its lower to its upper position disconnects the associated winding from the other windings. For example, when switch S4 is moved to its upper position, the output from winding 106c is directly connected through switch S4 to winding 106e, and the output voltage from 106d is no longer summed with the voltages from the remaining windings.

The relative phases of the voltages from secondary windings 106 and sensor 18 is controlled by a double-pole, double-throw, electronic switch 116 connected in the output leads from sensor 18. Switch 116 is controlled by the Q$\phi$ output from S.A.R. 26, which is denoted as the "sign bit." In response to the Q$\phi$ output from S.A.R. 26, switch 116 provides a 10 kHz signal from sensor 14 having either a negative or positive phase. Alternatively, the phase of the sensor output signal may be reversed by electronically switching between opposite polarity signals from the two halves of a center-tapped output transformer winding. Other methods may, of course, be used to control the relative phases in response to the level of Q$\phi$.

The windings selected by switches S1–S9 are connected in series with the output signal from sensor 18 across the inputs 30 to comparator circuit 28. Switch 116 is controlled so that the outputs from sensor 18 and windings 106 are of opposite phases, and since windings 106 and 108 are connected in series, the input voltage $V_e$ to comparator 28 indicates whether the voltage across windings 106 is greater than or less than the voltage from sensor 18. The output signal from comparator 28 is applied to S.A.R. 26 and also to control logic 14.

The A/D conversion is initiated by a start command applied from control logic 14 to S.A.R. 26. To begin the conversion, all switches S1–S9 are in their upper positions so that all windings 106a–106i are bypassed. The signal from sensor 18 is thus applied alone to the input of comparator circuit 28. The output from comparator 28 indicates the phase of the sensor output signal and is applied to the D input of S.A.R. 26. In response, the Q0 output of S.A.R. 26 is set high or low so that switch 116 causes the phase of the output voltage from sensor 18 to be opposite that of the voltage from secondary windings 106.

Next, the Q1 output from S.A.R. 26 goes high, causing switch S1 to connect winding 106a in series with sensor 18. The output from comparator circuit 28 indicates whether the voltage from sensor 18 exceeds the voltage from winding 106a, and if so, Q1 stays high so that winding 106a remains connected in series with sensor 18. Otherwise, Q1 returns low disconnecting winding 106a.

The above process is repeated for Q2 through Q9 to provide a 9-bit A/D conversion of the output voltage from sensor 18. At this point, the input to comparator circuit 28 is equal to the difference between the output voltage from sensor 18 and the 9-bit digital value represented by the outputs Q1–Q9 from S.A.R. 26. In other words, after the completion of the 9-bit digital analog conversion by D/A circuit 24 and S.A.R. 26, the error voltage $V_e$ applied to comparator circuit 28 is equal to the round-off error of the 9-bit digital conversion. This voltage will be referred to below as the "residue error voltage."

The Q9 output from S.A.R. 26 is also applied to the clock input of a flip flop 118. The D input of flip flop 118 is tied to a high level. Flip flop 118 is initially set to its zero state by the initialize pulse. At the beginning of the Q9 interval, the rising edge of the Q9 signal from S.A.R. 26 clocks flip flop 118, and its Q output goes to a high level. The Q output from flip flop 118 provides an end of conversion (E.O.C.) signal indicating that the successive approximation process is ending. Flip flop 118 serves to provide an E.O.C. signal which remains high following the successive approximation process, as opposed to Q9 which may remain high or return to zero, depending on the value of the analog signal from sensor 18.

Returning to FIG. 1, the details of comparator circuit 28 are shown within the dotted box. The $V_e$ signal applied to the input of comparator 28 on lines 30 is amplified by a precision amplifier circuit 22. Amplifier circuit 22 typically has a gain which is on the order of the range of D/A converter 24. In the described embodiment, amplifier 22 has a gain of approximately 1024.

The sine wave output from filter circuit 16 is applied to a limiter circuit 34. Limiter circuit 34 provides complimentary A and $\overline{A}$ 10 kHz squarewave signals which are precisely in phase with the sine wave output from filter 16.

The output from amplifier 22 is applied to a synchronous detector 32, to which are applied the A and $\overline{A}$ signals from limiter 34. Synchronous detector 32 demodulates the amplifier output to provide a rectified, unipolar signal proportional to the output signal from amplifier 22.

The output from synchronous detector 32 is applied via an electronic switch 36 to the input of an integrator circuit 38. Integrator circuit 38 may be a conventional integrating circuit, including an integrating capacitor 40 connected between the output and the inverting input of an op-amp 42. The input signal to integrator 38 is applied via a resistor 44 connected to the inverting input of the op-amp 42. Capacitor 40 is connected in parallel with an electronic switch 46 which is controlled by control logic 14. Closing switch 46 discharges capacitor 40 and resets integrator 42 to a zero output voltage state.

Integrator 38 may also be implemented as a 2-input, differential integrator of known type, having positive and negative inputs. This avoids the need for a precision, unity-gain, 10 kHz inverting amplifier in synchronous detector 32 (and also in synchronous detectors 62 and 64 discussed below). In this case, synchronous detector 32 merely consists of a switching circuit for applying alternate half cycles of the input signal to the positive and negative integrator inputs respectively. Switches 36 and 46 would then be duplicated by identical counterparts for applying the demodulated signal to the non-inverting input of the integrator and for resetting the second integrator capacitor connected to the non-inverting input.

The output from integrator 38 is applied to a limiting amplifier 48 which provides at its output a digital waveform representative of the polarity of the output voltage from integrator 38. The output signal from limiter 48 is applied to control logic 14 and also to the comparator input of successive approximation register 26.

Figure 3:
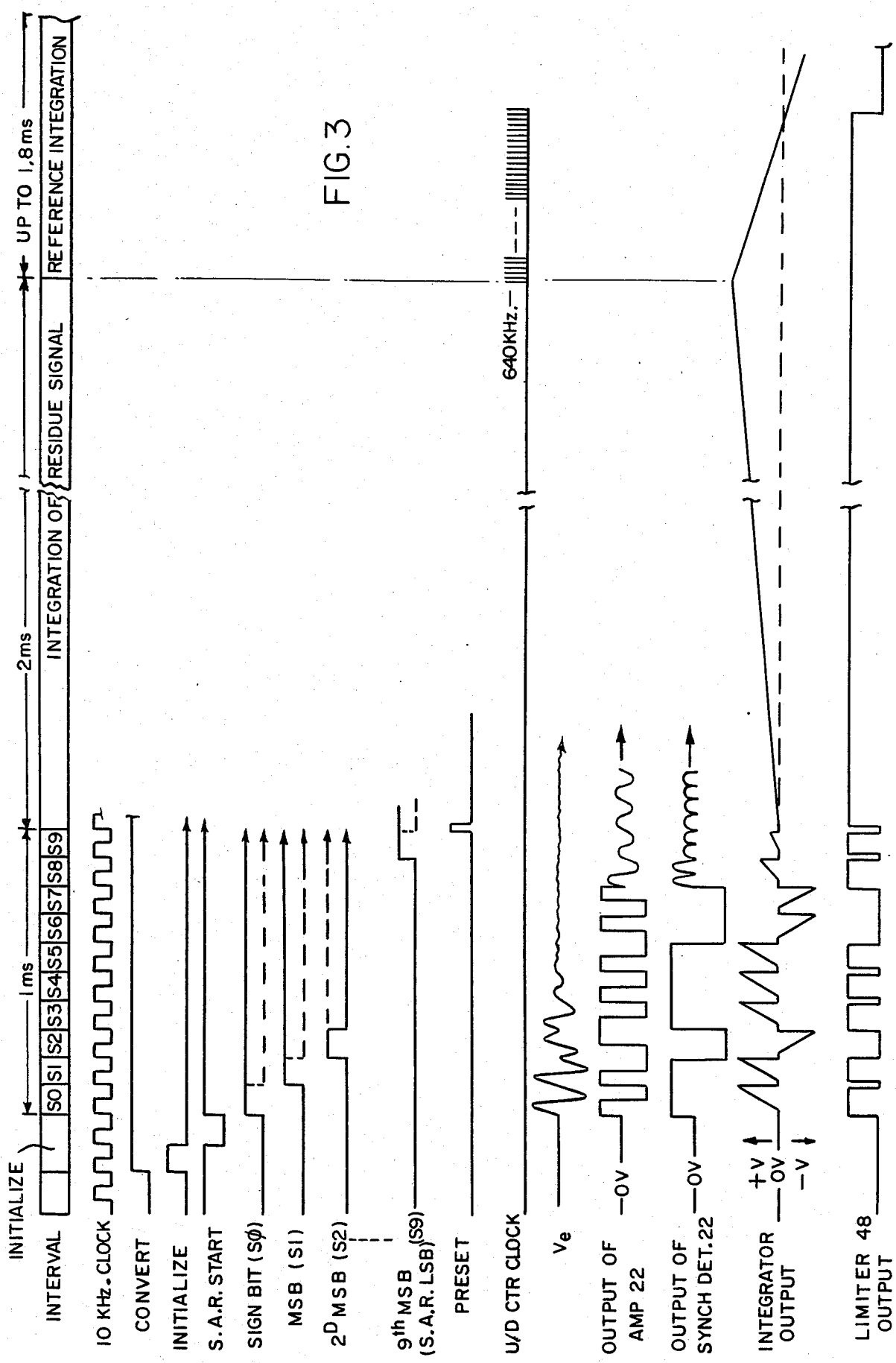
FIG. 3 is a timing diagram showing waveforms present at various points in the circuit of FIG. 1.

The operation of comparator circuit 28 may be most easily described by referring to the timing diagram shown in FIG. 3. The first line of FIG. 3 shows the different operational intervals of the A/D converter, and the second line shows the 10 kHz clock signal applied to various parts of the converter. The remaining lines shown the waveforms present at various points in the circuit. For purposes of explanation, the amplitudes of some of these waveforms are now drawn to scale.

After a 0.2 ms initialization interval during which various registers and counters are set to the appropriate values, the sign bit and the 9 most significant bits of the output are determined by the above-described successive-approximation process. Each bit of the 9 most significant sign bits requires one period of the 10 kHz clock signal, or 0.1 ms, for conversion.

The error signal $V_e$ is shown in FIG. 3 and is a sine wave signal whose amplitude decreases as the successive approximation from transformer D/A circuit 24 approaches the input signal as the conversion progresses. Although the error signal appears to go to zero in FIG. 3, such is generally not the case. Rather the amplitude of $V_e$ decreases to very small values as the successive approximation progresses.

The output from amplifier 22 represents the error voltage $V_e$ between the sensor output voltage and the output voltage from transformer 24. Due to the high gain of amplifier 22, this voltage may often be limited during the conversion of the MSB's, as shown for intervals S0 through S7 in FIG. 3. As the conversion progresses, the output voltage from transformer D/A 24 approaches the output voltage from sensor 18, and when the error voltage $V_e$ becomes low enough, the output voltage from amplifier 22 becomes a sine wave when amplifier 22 enters its linear region, as shown for intervals S8 and S9. The gain of amplifier 22 is chosen so that it will not saturate in response to an error voltage $V_e$ equal to one LSB from S.A.R. 26, the maximum possible value for $V_e$ after the end of the successive approximation conversion.

The amplified error voltage $V_e$ from amplifier 22 will be in phase or 180° out of phase with the A and $\overline{A}$ signals applied to synchronous detector 14, depending on whether the sensor output is greater or smaller than the transformer output. The resulting positive or negative signal from synchronous detector 32 is applied to the input of integrator 38 by switch 36. The polarity of the output signal from synchronous detector 32 indicates whether the amplitude of the 10 kHz output from D/A transformer 24 is greater than or less than the sensor output.

Switch 46 is momentarily closed to re-zero integrator 38 at the beginning of each 10 kHz clock period. Thus, the response of integrator 38 to a very small error signal is not affected by the presence of a very large error signal during the previous clock period. After switch 46 opens, the error signal is integrated for the remainder of the clock period to filter any random noise which may be present in the $V_e$ signal. The resulting output from integrator 38 is converted to a digital level by limiter 48.

After the above-described conversion of the 9 most significant bits plus sign, the 9 least significant bits are determined in the following manner. The residue error voltage is then applied to the input of integrator 38 and integrated for a fixed period of time. Typically, the fixed time period is measured by a counter which is clocked at regular intervals. Following the residue integration interval, the residue error voltage is replaced by a known reference voltage of opposite polarity. In response to the reference voltage, the integrator output ramps back toward zero, and the time required for the integrator output to reach zero volts represents the magnitude of the residue error voltage, as in a conventional dual-slope conversion.

The reference integration period, during which the reference voltage is integrated, is timed by an 18-bit, preset table, up/down counter 50. Prior to the reference integration period, the 9-bits from S.A.R. 26 are applied to the 9 most significant preset inputs of counter 50; a low level is applied to the 9 least significant preset inputs; and the counter is preset by a signal from control logic 14. The gain of amplifier 22 is chosen so that integrating the reference voltage for 512 ($2^9$) clock periods results in an output voltage from integrator 42 equal to the magnitude of one LSB from S.A.R. 26. Thus, using the 9 LSB's of counter 50 to time the reference integration period causes the final value is counter 50 to be an 18-bit representation of the magnitude of the sensor output signal.

To begin the conversion of the last 9 bits, switch 46 is momentarily closed by a preset signal, shown in FIG. 3, to discharge capacitor 40 and zero integrator 38. Switch 46 then opens and the output from amplifier 22 and synchronous detector 32 is applied to integrator 38 for a fixed period of time, as in a conventional dual-slope conversion. The period of time is chosen to be an exact, integral multiple of the 10 kHz signal which is applied to synchronous detector 38 by limiting amplifier 34. This ensures that the first integration period includes an integral number of cycles of the demodulated 10 kHz output from amplifier 22.

Following the integration of the residue error voltage, control logic 14 opens switch 36. The output from limiter 48 at this time is a digital value which indicates whether the integrated residue voltage is positive or negative. In response, control logic 14 closes one of two electronic switches 60 and 62 to provide a positive or negative reference voltage to the input of integrator 38. The polarity of the reference is such that the integrator output voltage ramps back toward zero volts, as shown in FIG. 3.

The positive and negative reference voltages applied to integrator 38 during the second integration interval are derived in the following manner. The sine wave output from filter 16 is applied to two synchronous detectors 62 and 64. Each of these synchronous detectors demodulates the output signal from filter 16 with the A and $\overline{A}$ signals from limiter 34. The polarities of synchronous detectors 62 and 64 are opposite one another to provide positive and negative output signals from the two detectors.

The use of synchronous detectors 62 and 64 to derive the positive and negative reference voltages provides the most accurate voltages for these references. Typically, sensor 18 produces an output voltage which is proportional to the input voltage. The proportionality constant represents the parameter being measured. Thus, it is not the absolute magnitude of the output voltage from sensor 18 which is important, but rather the relationship between the output of sensor 18 and its input signal, the sine wave signal from filter 16. By using synchronous detector circuits 62 and 64 which are identical to synchronous detector circuit 32, any small errors in the output signal from these detectors will tend to cancel each other, increasing the accuracy of the converter. Such errors could result, for example, from small phase shifts between the output of filter 16 and limiter 34 or small changes in the amplitude of the output signal from filter circuit 16.

The output signals from detectors 60 and 62 are applied to two filter circuits 66 and 68. Filters 66 and 68 are typically unity-gain, two-pole, low-pass, active filters with a cut off frequency of about 400 Hz. The purpose of filters 66 and 68 is to provide D.C. signals for the positive and negative references. During the first integration period, the residue error voltage from synchronous detector 32 is integrated for a known period of time, and this period is chosen to include an integral number of rectified cycles of the residue error voltage.

The integration of the selected reference voltage is for an unknown period of time, however, since the end of this integration period is determined when the output from integrator 38 returns to zero. If the rectified signals from synchronous detector 62 were applied directly to integrator 38, non-linearities in the converter output could result from ending the integration of an unknown point in the rectified sine wave reference signal. Filters 66 and 68 provide relatively constant reference signals to reduce or eliminate such errors.

The period required for integrator 38 to ramp back to zero during the reference voltage integration period is timed by preset up/down counter 50. A 640 kHz clock signal from divider circuit 12 and oscillator 10 is applied to control logic 14, and this clock signal clocks counter 50 during the reference integration period.

An up/down signal from counter logic 14 controls whether control 50 clocks up or down. This allows the 9-bits determined by S.A.R. 26 and preset into counter 50 to be both incremented and decremented by the 9 LSB's accumulated in counter 50, for reasons discussed in detail below.

When the output from integrator 38 crosses zero, the output from limiter 48 changes state. In response, control logic 14 removes the clock signal from counter 50. The value in counter 50 at this time is an 18-bit digital value representing the amplitude of the 10 kHz output signal from sensor 18. The exact value measured by the present invention is the average value of the output signal from sensor 18, averaged over the 2 ms period during which $V_e$ is integrated by the converter.

The reference integration interval varies in length, depending on the value of $V_e$, but may take up to 1.8 ms, or 1152 clock periods of the 640 kHz clock signal. As described above, 512 bits of counter 50 are equal to one LSB from S.A.R. 26. Thus, as described in more detail below, the 9 bit value determined during the successive approximation may be modified by plus or minus two bits during the reference integration interval.

Figure 4:
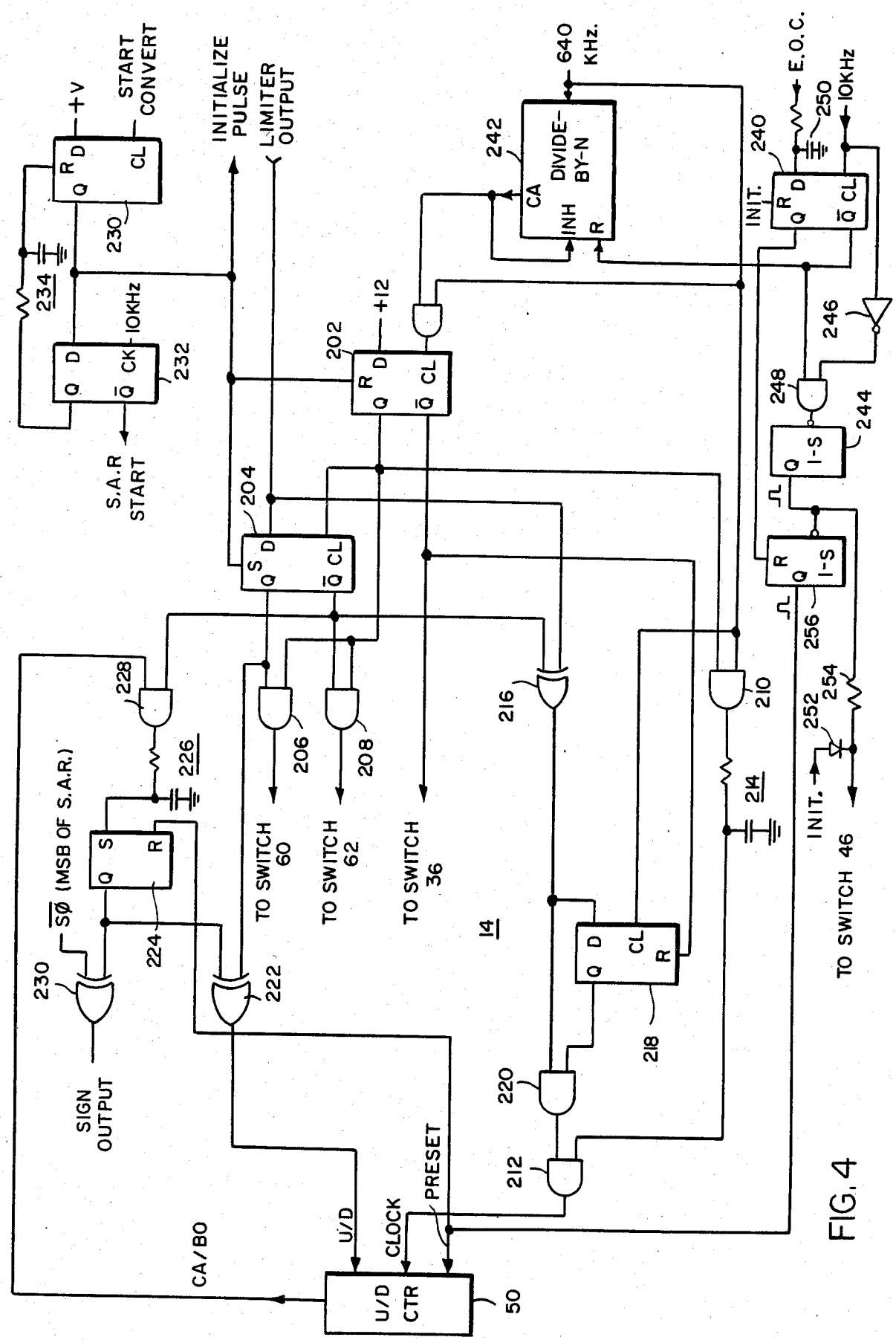
FIG. 4 shows further details of the control logic circuit shown in FIG. 1.

FIG. 4 shows the circuitry of control logic 14. The "convert" signal is applied to the clock input of a D flip flop 230, shown at the top of FIG. 4. The input of flip flop 230 is tied high. The Q output from flip flop 230 provides the initialize pulse which resets various registers in the analog-to-digital converter prior to each conversion. The Q output from flip flop 230 is applied to the D input of a second D flip flop 232. D flip flop 232 is clocked by the 10 kHz reference signal. The $\overline{Q}$ output from flip flop 232 provides the S.A.R. start signal. The Q output from flip flop 232 is fed back to the reset input of flip flop 230 via an RC delay network 234.

Prior to a conversion, flip flop 230 and 232 are in their reset state. In response to a rising edge in the convert signal, flip flop 230 is clocked, and the Q output therefrom goes high to provide the initialize pulse. At the next 10 kHz clock pulse, flip flop 232 is in turn clocked; its $\overline{Q}$ output goes low, providing the S.A.R. start signal; and the Q output goes high resetting flip flop 230 after a short delay provided by delay network 234. On the next 10 kHz clock pulse, the low output from flip flop 230 is clocked into flip flop 232, resetting it to its original state.

The 10 kHz clock signal is also applied to the clock input of another D flip flop 240, shown at the bottom of FIG. 4. The E.O.C. signal from S.A.R. 46 is applied to the D input of flip flop 240. Flip flop 240 is initially reset by the initialization pulse. In response to a high E.O.C.

signal, flip flop 240 changes state to indicate the beginning of the residue signal integration interval.

A multivibrator or one-shot circuit 244 provides the control signal applied to switch 46 for resetting integrator 38. The 10 kHz clock signal is inverted by an inverter 246 and applied to the falling-edge trigger input of one-shot 244 via an AND gate 248. AND gate 248 is enabled and disabled by the $\overline{Q}$ output from flip flop 240. During the successive approximation interval, the $\overline{Q}$ output of flip flop 240 is high enabling AND gate 248, and one-shot 244 is clocked by the 10 kHz clock signal to provide a reset pulse to switch 46 at the beginning of each 10 kHz clock period. The E.O.C. signal is delayed by an RC delay network 250 so that the E.O.C. signal is not clocked into flip flop 240 until after the Q9 interval. This provides a final reset pulse following the end of the successive approximation to reset integrator 38 prior to the integration of the residue signal. The initialize pulse is also applied to switch 46 via a diode 252 to reset integrator 38 at the beginning of each A/D conversion process. A resistor 254 connected in series between diode 252 and the Q output of one-shot 244 isolates the output of one-shot 244 from the initialize pulse.

The pulses from one-shot 244 are applied to the falling-edge trigger input of a second one-shot 256. The output from one-shot 256 is applied to the preset input of up/down counter 50 and serves to clock the value from S.A.R. 26 into counter 50 at the end of the successive approximation interval. Since one-shot 256 is clocked each time that the integrator is reset, several preset pulses which serve no purpose are produced during the successive approximation interval. The up/down counter is preset with the final value from S.A.R. 26 by the last preset pulse prior to the beginning of the residue signal integration period. The Q output from D flip flop 240 goes high at the beginning of the residue integration period and is applied to the reset input of one-shot 256, inhibiting further pulses from one shot 256. This prevents the final integrator clearing pulse produced by one-shot 244 from triggering one-shot 256.

A divide-by-N counter 242 determines the length of the residue signal integration period in the following manner. The $\overline{Q}$ output from flip flop 240 is applied to a reset input of counter 242, which is clock by the 640 kHz clock signal. Prior to the beginning of the reference integration period, counter 242 is maintained in a reset or zero state by the high $\overline{Q}$ signal from flip flop 240. When the $\overline{Q}$ signal goes low at the beginning of the reference integration period, counter 242 is clocked by the 640 kHz clock signal. In the present embodiment, the divide-by-N circuit is chosen to divide by 1280 to provide a 2 ms residue integration interval.

After 1280 clock pulses, the carry output (CA) from counter 242 goes high, indicating the end of the residue integration interval and the beginning of the reference integration interval. The carry signal is applied to an inhibit input of counter 242 which prevents the counter from counting further until it is reset by the $\overline{Q}$ signal from flip flop 240.

The signals controlling switches 36, 60, and 62, which select the input to integrator 38, are provided in the following manner. The initialize pulse is applied to the reset input of D flip flop 202, and the $\overline{Q}$ output from flip flop 202 is applied to switch 36 to control the application of the output signal from synchronous detector 32 to integrator 38. In response to the initialize pulse at the beginning of a conversion, the $\overline{Q}$ output of flip flop 202 goes high, closing switch 36 and applying the output from synchronous detector to integrator 38. The $\overline{Q}$ output remains high until the end of the residue integration period.

The carry signal from counter 242 is applied to one input and an AND gate 243, and the 640 kHz clock signal is applied to a second input of AND gate 243. AND gate 243 is disabled by the low carry signal from counter 242 until the beginning of the reference integration interval, at which time AND gate 243 is enabled, applying the 640 kHz clock signal to the clock input of a D flip flop 202. The D input of flip flop 202 is connected to a high logic level, and in response to the first 640 kHz clock pulse from AND gate 243 at the beginning of the reference integration interval, flip flop 202 changes state. The $\overline{Q}$ output goes low, opening switch 36, and the Q output goes high, enabling AND gates 206 and 208.

The outputs from AND gates 206 and 208 control switches 60 and 62 and select which of the positive or negative reference voltage signals is applied to integrator 38 during the reference integration interval. The output from limit amplifier 48 indicates the polarity of the integrated output signal and is applied to the D input of flip flop 204. The clock signal to flip flop 204 is taken from the Q output of flip flop 202, and flip flop 204 is clocked by the rising Q output from flip flop 202 at the beginning of the reference integration interval. Thus the output of flip flop 204 indicates the output state of limiter 48 at the end of the residue integration interval. The Q and $\overline{Q}$ outputs from flip flop 204 are applied via gates 206 and 208 to switches 60 and 62. Gates 206 and 208 are enabled at the beginning of the reference integration interval by flip flop 202, and the appropriate positive or negative reference voltage is applied to the input of integrator 38 by switches 60 and 62 in response to the outputs of gates 206 and 208.

The clock signal for counter 50 is provided in the following manner. The Q output from flip flop 202 is applied to one input of an AND gate 210. The 640 kHz clock signal from divider 12 is applied to a second input to AND gate 210 from which the up/down counter clock signal is derived. Gate 210 is disabled by the low Q output from flip flop 202 until the reference integration period begins. At this time, the clock signal is applied by gate 210 to another AND gate 212 via an RC network 214 which slightly delays the clock signal applied to gate 212.

The output from limiter 48 is applied to one input of an XOR gate 216, and the $\overline{Q}$ output from flip flop 204, representative of the inverse of the polarity of the integrator output at the beginning of the reference integration, is applied to the second input. The output from limiter 48 changes state when the integrator output crosses zero. By exclusive-orring, the instantaneous limiter output signal with the inverse of its value at the beginning of the reference integration period, the output of XOR gate 216 is always high during the reference integration and always changes from a high to a low level when the integrator output crosses zero at the end of the reference integration, regardless of the polarity of the zero crossing.

The output from XOR gate 216 is applied to the D input of a flip flop 218. Flip flop 218 is held in a reset state by the $\overline{Q}$ output from flip flop 202 until the beginning of the reference integration period. The 640 kHz clock signal is applied to the clock input of flip flop 218, and when the $\overline{Q}$ output from flip flop 202 goes low at the beginning of the reference integration, the high output from XOR gate 216 appears at the Q output of flip flop 218 at the next clock pulse. This high output and the high output from XOR gate 216 are applied to an AND gate 220 whose output enables gate 212 at the beginning of the reference integration interval to provide the 640 kHz clock signal to up/down counter 50. When the integrator output crosses zero to end the reference integration interval, the limiter output changes state, and the output from XOR gate 216 goes low. This immediately disables gates 220 and 212, removing the clock from the up/down counter. In this manner, the clock signal shown in FIG. 3 is provided for up/down counter 50.

Both positive and negative voltages are converted in the same manner by the described embodiment of the present invention, with the exception of the first bit. In response to a negative output signal from sensor 18, the state of switch 116 in FIG. 2 is changed by bit S0 from S.A.R. 46 changing the phase of the output signal from sensor 18 from negative to positive. The remainder of the conversion then proceeds as described above. Thus, for a non-changing voltage from sensor 18 (and neglecting the effects of any noise), the residue voltage will always be positive.

The output of sensor 18 may change with time, however, and because of this, counter 50 sometimes must count down during the reference integration period. For example, if the sensor output signal is changing in the negative direction, the average residue error voltage $V_e$ accumulated by integrator 38 over the residue integration interval may be negative. In this case, the value preset into counter 50 from S.A.R. 46 must be decremented rather than incremented.

A second situation occurs for very small input voltages, on the order of 1 to 2 LSB's of S.A.R. 46. Assume a situation where the S.A.R. output is equal to 1 LSB (i.e. binary 01) and the voltage from sensor 18 goes from this small positive value to a negative final value such that the average value of the sensor output voltage over the residue integration period is negative. In this case, counter 50 counts down from the preset value from S.A.R. 46 until it reaches zero. The counter must then change direction and begin counting up, since the described embodiment provides an output in sign-magnitude form, and the counter must not be allowed to recycle.

The circuitry shown in FIG. 4 provides the proper signals to the up/down counter to implement the above-described operation. The output from limiter 48 at the beginning of the reference integration period is clocked into flip flop 204, as described above, and is applied to the up/down input of counter 50 via an XOR gate 222. A second input to XOR gate 222 comes from the Q output of a R-S flip flop 224. Flip flop 224 is set at the beginning of the dual-slope integration by the preset signal applied to counter 50 so that its output is low.

The carry/borrow (CA/BO) signal from counter 50 is applied via an AND gate 228 and delay network 226 to the set input of flip flop 224. A carry/borrow signal will be generated by counter 50 if and when the value in the counter is zero. This sets flip flop 224 causing its Q output to go high. Gate 228 is disabled by the $\overline{Q}$ output from flip flop 204 until the beginning of the reference integration period. Gate 228 in conjunction with delay network 226 serve to prevent flip flop 224 from being set during the reference integration interval by the CA/BO output counter 50 in the event that a value of zero from the S.A.R. is preset into counter 50.

Thus, a high Q output from flip flop 224 indicates that the representation in the counter of the input signal from sensor 18 has gone from a positive value to a negative value during the reference integration interval. This signal causes the up/down input to counter 50 to change state via XOR gate 222 and also is combined with $\overline{S0}$ (the inverse of the sign bit from S.A.R. 26) by XOR gate 230 to provide the actual sign output from the converter.

It should be appreciated that the present invention may be implemented using notation conventions other than the sign magnitude convention shown, such as one's complements, two's complements; or other conventions. Circuits for converting between such different types of notations are well known, and modifying the preferred embodiment described herein to provide such an output would be obvious to one of ordinary skill in the art.

There has been described a new and useful analog-to-digital converter having numerous advantages over those previously known in the art. The description herein of a preferred embodiment is intended only to show one example of the present invention, and modification and additions to the preferred embodiment described herein will routinely be made by those of ordinary skill in the art in applying the teachings of the present invention to different situations. Accordingly, the invention should not be construed as being limited by such a description of the preferred embodiment, but instead should be interpreted in accordance with the following claims.

I claim:

1. An analog-to-digital converter circuit for providing a digital output signal representative of the voltage amplitude of an A.C. input signal, comprising:
   a digital-to-analog converter circuit, including:
      a multiple wiring transformer having one input winding and a plurality of output windings;
      means for applying an AC reference signal to the transformer input winding;
      a plurality of switching means, responsive to a plurality of first digital signals, for connecting selected ones of the plurality of output windings in series for providing an A.C. transformer output signal having an amplitude which is determined by the plurality of first digital signals applied thereto;
   means for connecting the A.C. input signal in series with the A.C. transformer output signal to provide a difference signal representative of the difference therebetween, including means for assuring that the A.C. reference signal is in phase with the AC input signal;
   comparator means responsive to the difference signal for providing a comparator output signal representative of which of the A.C. input signal and the transformer output signal is larger;
   means, responsive to the comparator output signal, for providing during a first time interval the plurality of first digital signals to the digital-to-analog converter circuit so as to produce a transformer output signal whose amplitude approximates the amplitude of the input signal;
   means for integrating the difference signal during a second time interval which follows the first time interval and for providing a first integrator output signal representative of the integral of the difference signal over the second time interval;

means for integrating a reference signal during over a variable third time interval which follows the second time interval until the magnitude of the integrated reference signal is equal to the first integrator output signal; and means for determining the duration of the variable third time interval and for providing a plurality of second digital signals representative of the duration of the second time interval;

the first digital signals and the second digital signals respectively representing the most significant bits and the least significant bits of said digital output signal.

2. The circuit of claim 1 wherein the first and second mentioned means for integrating include:
   an integrator responsive to a signal applied to an input terminal thereof for providing an output signal representative of the integral of the input signal;
   means for resetting the integrator to zero prior to the beginning of the second interval;
   means for applying the difference signal to the integrator input during the second interval;
   means for applying the reference signal to the integrator input during the third interval with a polarity such that the integrator output signal returns to zero during the third interval; and
   means for terminating the third time interval when the integrator output signal reaches zero.

3. The circuit of claim 2,
   wherein the means for determining includes a counter which is periodically incremented during the third interval to determine the length of the third interval;
   and further including means for presetting the value represented by the first digital signals into the counter prior to the third interval, the value in the counter at the end of the third interval providing said digital output signal.

4. The circuit of claim 3,
   wherein the counter is an up/down counter which counts up or down in response to a control signal applied thereto;
   and further including means for providing the up/down counter control signal as a function of the polarity of the integrator output signal at the end of the second interval.

5. The circuit of claim 1 wherein the multiple-winding transformer includes:
   a primary winding; and
   a plurality of secondary windings having turns ratios differing by factors of 2 to provide output signals from said secondary windings forming a binary series.

6. The circuit of claim 5 wherein the digital-to-analog converter circuit further includes:
   a plurality of switches, responsive to the first digital signals, for selectively interconnecting individual ones of said plurality of secondary windings in series with one another.

7. An analog-to-digital converter circuit for providing a digital representation of an A.C. input signal of unknown value, comprising:
   a transformer having a primary winding and a plurality of secondary windings;
   means for providing an A.C. reference signal to the transformer primary winding;
   switching means, responsive to a plurality of digital signals applied thereto representative of designated secondary windings, for selectively connecting the designated windings in series with one another, the voltage across the series-connected secondary windings being the transformer output signal;
   means for connnecting the A.C. input signal in series with the transformer output signal, including:
     means for assuring that the A.C. reference signal is in phase with the A.C. input signal; and
     amplifier means for providing an output signal representative of the difference between the A.C. input signal and the transformer output signal;
   means responsive to the amplifier output signal for providing the digital signals to the switching means so that the amplitude of the transformer output signal approaches the amplitude of the A.C. input signal during a first time interval;
   a presettable counter;
   means for presetting the most significant bits of the counter to the value of the digital signals following the end of the first interval;
   an integrator circuit;
   means for applying the amplifier output signal to the integrator circuit during a second time interval following the first time interval;
   means for applying a reference signal to the integrator circuit during a variable third time interval which follows the second time interval;
   means for ending the third time interval when the integrator output signal equals zero; and
   means for applying a clock signal to the counter during the third interval.

8. The circuit of claim 7 wherein the means for providing an A.C. reference signal further includes:
   means for providing an A.C. excitation signal to a sensor which provides the A.C. input signal by modulating the amplitude of the A.C. excitation signal.

9. The circuit of claim 8 wherein the amplifier means further comprises:
   an input stage having input terminals across which the input signal and the transformer output signal are connected in series, the input stage providing an output signal representative of the signal across the input terminal; and
   means responsive to the A.C. excitation signal for demodulating the output signal from the input stage.

10. The circuit of claim 9 wherein the demodulating means includes a synchronous detector.

11. The circuit of claim 10 wherein the reference signal applying means includes means for selectively applying positive or negative reference signals to the integrator, the polarity of the reference signal being selected in response to the polarity of the integrator output signal at the end of the second interval.

12. The circuit of claim 11 wherein the reference signal applying means includes second and third synchronous detectors, each responsive to the A.C. excitation signal, for respectively providing demodulated output signals of opposite polarities.

13. The circuit of claim 12 wherein the reference signal applying means further includes a low-pass filter connected to the output of each of the second and third synchronous detectors to provide relatively constant positive and negative D.C. reference signals.

14. The circuit of claim 13 further including:

means for applying the amplifier output signal to the integrator input during the first interval to provide filtering of the amplifier output signal; and means for resetting the integrator to zero after the determination of each of the digital signals.

15. The circuit of claim 14 wherein the counter is an up/down counter and including means for causing said counter to count up or down during the third interval as a function of the polarity of the integrator output signal.

16. The circuit of claim 15 wherein the means for providing the digital signals includes a successive approximation register responsive to the amplifier means output signal for providing the digital signals applied to the switching means, the successive approximation register being operative to sequentially determine the value of each of the digital signals.

17. The apparatus of claim 15 wherein said means for causing includes: means, responsive to the value of the counter, for reversing the direction of counting of the counter in response to a value of zero in the counter.

18. The circuit of claim 13 wherein the counter is an up/down counter and including means for causing said counter to count up or down during the third interval as a function of the polarity of the integrator output signal.

19. The apparatus of claim 18 wherein said means for causing includes:

means, responsive to the value in the counter, for reversing the direction of counting of the counter in response to a value of zero in the counter.

* * * * *